United States Patent
Chambers

Patent Number: 5,819,294
Date of Patent: Oct. 6, 1998

[54] AUTOMATIC CONFIGURATION MECHANISM FOR UNIVERSAL REMOTE

[75] Inventor: Paul Chambers, San Jose, Calif.

[73] Assignee: Philips Electronics North America Corporation, New York, N.Y.

[21] Appl. No.: 907,284

[22] Filed: Aug. 6, 1997

[51] Int. Cl.[6] .................................................. G06F 17/30
[52] U.S. Cl. .............................. 707/104; 340/825; 348/7
[58] Field of Search ........................... 707/104; 340/825; 348/7

[56] References Cited

U.S. PATENT DOCUMENTS

| | | | |
|---|---|---|---|
| 4,774,511 | 9/1988 | Rumbolt et al. | 340/825 |
| 4,866,434 | 9/1989 | Keenan | 340/825 |
| 4,897,883 | 1/1990 | Harrington | 348/7 |
| 4,918,439 | 4/1990 | Wozniak et al. | 348/7 |
| 5,410,326 | 4/1995 | Goldstein | 340/825 |
| 5,485,149 | 1/1996 | Takiguchi et al. | 340/825 |
| 5,635,979 | 6/1997 | Kostreski et al. | 707/104 |

OTHER PUBLICATIONS

"Take Control", Home Theater, Nov. 1996, pp. 40–42.
"System Remote Control", by Lawrence E. Ullman, Home Theater, Winter 1996, pp. 123–126.

*Primary Examiner*—Thomas G. Black
*Assistant Examiner*—Thu-Thao Havan

[57] ABSTRACT

A programmable remote controller is programmed by a PC that has an onboard data base for sets of codes used by a variety of commercially available remote controllers. The data base contains sets of compressed codes. In order to program the remote, the user lets the PC find a match between a single pulse-code transmitted by a specific known controller on the one hand and an item in the data base on the other hand. Upon finding the match, the set containing the matching item is stored in the programmable controller as corresponding to the particular apparatus that is controllable via the specific remote.

4 Claims, 3 Drawing Sheets

AUTOMATIC CONFIGURATION MECHANISM FOR UNIVERSAL REMOTE

FIELD OF THE INVENTION

The invention relates to a programmable control device for control of an apparatus. The invention also relates to a information processing system, in particular, but not exclusively, to a home entertainment system.

BACKGROUND ART

A well known example of a control device is the hand held remote controller for control of consumer audio and video equipment. The controller communicates control signals according to the particular user-input activated, typically a button or a soft-key on a GUI with touch screen functionality. The majority of modern wireless remote control devices use an infra-red (IR) pulse code modulated carrier to send the control signals. The code is binary and varies in time duration and in bit length. The code is modulated with a frequency of, typically, 40 kHz to filter out other IR sources. Different brands of equipment and different types of equipment of the same brand operate under control signals that are encoded differently. In practice, this means that the user has to juggle a variety of different remotes when interacting with his/her audio and video equipment.

The need for a universal control device has been recognized. Marantz has been marketing a programmable remote control device referred to as the RC2000. See, for example, the November 1996 issue, pp.40–42, and the winter 1996 issue, pp. 123–126, of the magazine "Home Theater". The device has a learning mode: it can learn IR commands from other conventional remotes. The RC2000 is capable of recording a coded pulse stream from a conventional transmitter and associating it with the relevant one of its buttons.

OBJECT OF THE INVENTION

The programming of such a control device requires the recording and associating to be done for each and every pulse stream individually. This is likely to be time-consuming and tedious. It is therefore an object of the invention to facilitate the programming of a programmable control device.

SUMMARY OF THE INVENTION

To this end, the invention provides an information processing system comprising at least one apparatus with multiple user-controllable functionalities, and a programmable control device. The control device has a user-interface with multiple user-inputs for selective control of a particular one of the functionalities of the apparatus through sending a particular one of multiple control signals to the apparatus once the device is programmed. The system has programming means to program the control device. The programming means comprises memory means for storing a data base with a plurality of respective sets of multiple control signals, and an input for receiving a specific control signal from an external agent. The programming means is operative to identify a specific one of the stored sets on the basis of the specific control signal or on the basis of a number of specific control signals substantially smaller than the number of signals in the set. The programming means programs the programmable controller to associate the control signals of the identified set with the multiple user-inputs.

The invention is based on the following insight. Different brands of apparatus with basically similar functionalities, such as audio or video equipment marketed by different manufacturers, are controlled by different sets of control signals. The consumer, who has several apparatus of different brands has to juggle as many different control devices as there are different apparatus and brands represented in his equipment. The invention provides a short cut to programming a single universal control device in order to control the entire collection of apparatus. The system of the invention has a data base that stores sets of control signals for each major brand. The system finds the set that matches the user's apparatus or collection of apparatus. This is achieved by identifying the matching set in a few steps, and by programming the control device to activate the appropriate signal of the set when a user-input, e.g., a button or a soft-key on a GUI, is activated. Identification of the matching set is based on comparing a known control signal, e.g., from the conventional remote that comes with a particular apparatus, with the signals in all stored sets. Upon a match between the specific signal supplied by the conventional control device and a single signal of a particular set stored, the entire set can be identified and linked to the programmable device's user-interface through the programming means.

BRIEF DESCRIPTION OF THE DRAWINGS

The invention is further explained by way of example and with reference to the accompanying drawings, wherein.

Throughout the figures, same reference numerals identify similar or corresponding components.

DETAILED EMBODIMENTS

Figure 1:
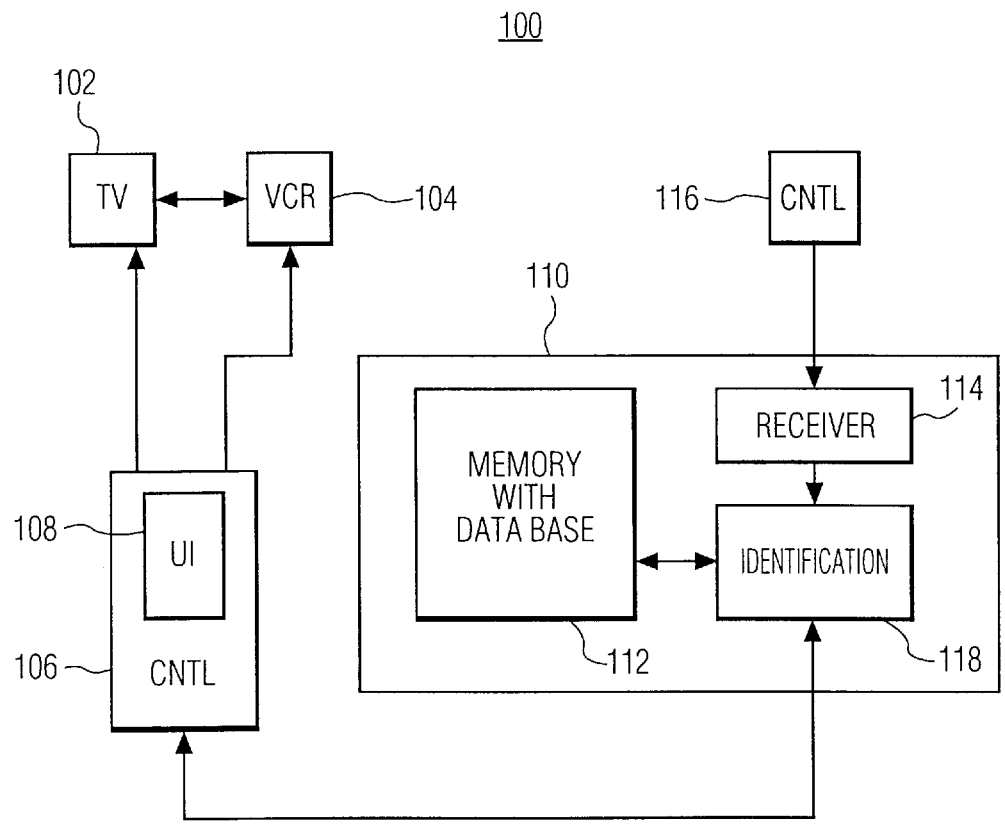
FIG. 1 is a block diagram of a system of the invention.

FIG. 1 is a block diagram of an information processing system 100 according to the invention. System 100 is, in this example, a home entertainment system. System 100 comprises a first apparatus 102, here a TV tuner. Apparatus 102 has multiple functionalities that are user-controllable, e.g., "TV-on/off", "channel up/down", "mute", "brightness up", etc. System 100 has also a second apparatus 104, here a VCR, also with multiple user-controllable functionalities: "on", "play", "record", "eject tape", etc. System 100 further comprises a programmable control device 106 having a user-interface (UI) 108 with multiple user-inputs (e.g., buttons, or soft keys on a GUI, not shown). The multiple user-inputs provide selective control of a particular one of the functionalities of apparatus 102 and 104 by sending a particular one of multiple control signals once device 106 is programmed. In this example, device 106 is a programmable, hand held IR remote controller for consumer equipment. The invention is, however, not limited to hand held control devices, nor to IR communication, nor to remotes, nor to a consumer environment. System 100 further comprises programming means 110 for programming of control device 106. Programming means comprises a memory 112 storing a data base with a plurality of data. Each respective data is representative of a respective set of control signals in compressed digital format. Each respective set comprises control signals for control of a respective one of a plurality of apparatus. The apparatus may differ in type, e.g., a TV receiver versus a DVD-player; and/or the apparatus may differ in brand, e.g., Philips, Marantz, etc.

Programming means 110 has a receiver 114 for receiving a specific control signal provided by an external source, e.g., a conventional remote controller 116 that comes with TV 102. The specific control signal is, for example, the IR control signal that controls a functionality X (brightness) of an apparatus of type Y (TV set 102) manufactured by a company Z (Philips). Receiver 114 samples the specific signal received and converts the sampled signal into a digital word of a compressed data format. The programming means has identifying means 118 that queries memory 112 in order to verify if memory 112 stores a data item that is representative of this digital word. If identifying means 118 retrieves a matching data item, the data corresponding with the complete set of control signals that contains this specific control signal is identified. That is, identification is accomplished on the basis of the specific control signal received by receiver 114. This is explained in further detail below with reference to FIG. 2. Once a set has been identified, programming means 110 configures programmable controller 106 to associate the control signals of the identified set with the multiple user-inputs. Configuration of control device 106 for VCR 104 is hereupon achieved in a similar manner.

Programming means 110 is integrated with, for example, a PC that is accommodated with suitable interfaces to receive the signals from conventional controller 116 and to transmit data to programmable control device 106. Typically, such a PC forms the center part of a home entertainment system and serves both to control of the consumer equipment, e.g., for playing video games and to provide access to the Internet with a web browser. Control device 106 and programming means 110 could be integrated with each other as well.

Preferably, UI 108 comprises a graphical user-interface (GUI) on a display (not shown) with a touch screen functionality. GUI 102 provides a lay-out with graphical representations of selectable and controllable functionalities for equipment in a home entertainment system. Preferably, the data that is representative of the identified set control signals also comprises the graphics information for the visual representation of the selectable and controllable items on GUI 102 for the set corresponding with this particular control mode. That is, each set not only comprises data representative of the control signals or IR commands, but also for the graphics information.

Figure 2:
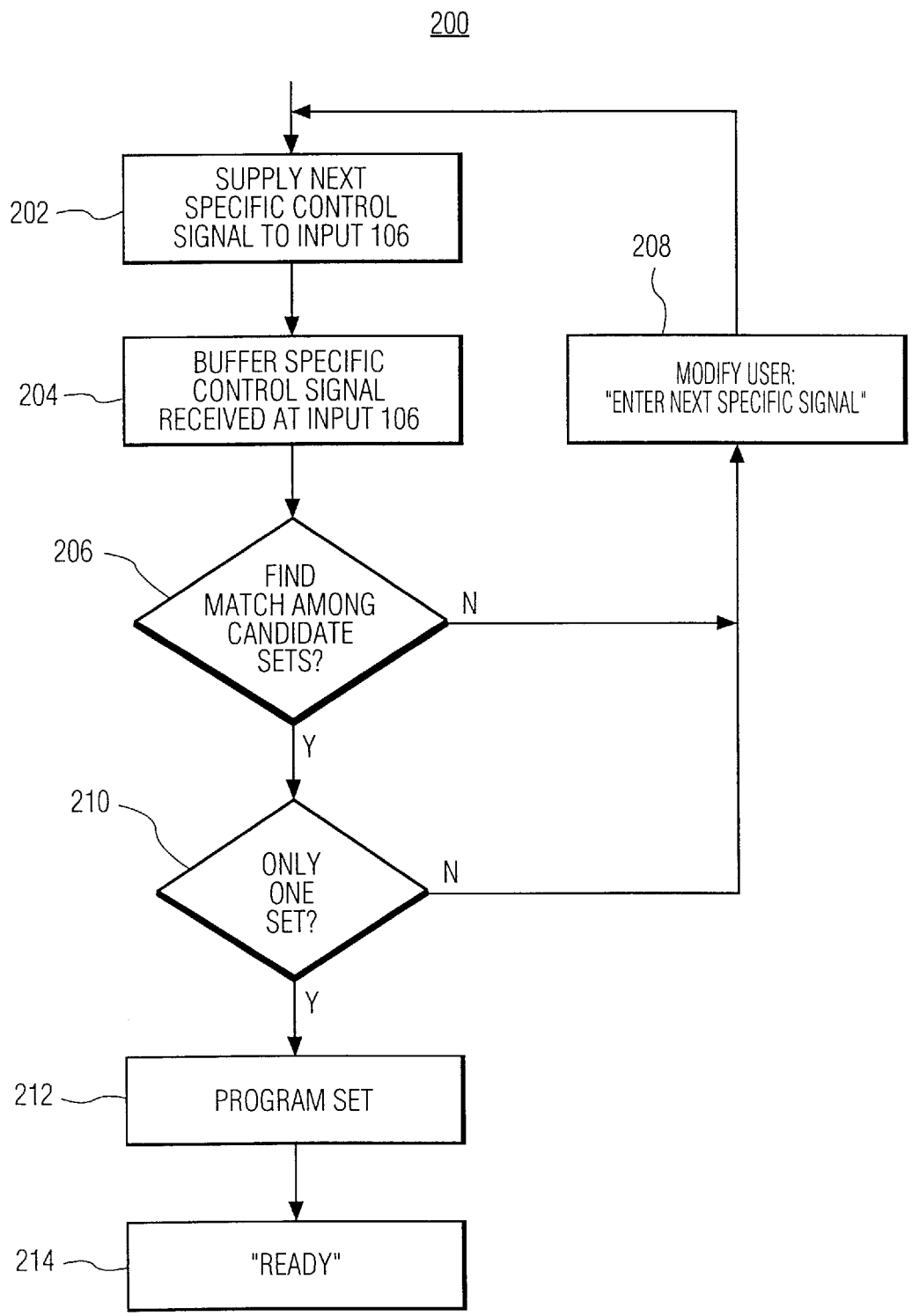
FIG. 2 is a flow diagram explaining the steps in the programming of the control device.

FIG. 2 is a flow diagram 200 illustrating the identification procedure carried out by identifying means 118. It is assumed that control signals are clustered. That is, a certain control signal always occurs in a group with certain other control signals. If two sets of control signals for control of two apparatus of a particular type, e.g., a TV tuner, have one control signal in common, the sets have an overlap that comprises multiple control signals.

In step 202, a specific control signal transmitted by conventional control device 116 for control of a specific apparatus, here TV set 102, is captured by receiver 114. In step 204, the received signal is sampled and buffered. In step 206 identifying means 118 checks memory 112 to determine whether or not memory 112 stores a data item that is representative of the sampled specific signal received from conventional controller 116. If there is no such data item, programming means 110 notifies the user in step 208, e.g., through a display (not shown), that the signal received from control device 116 is of an unknown format and requests a next specific control signal. This leads back to steps 202 and 204 and starts a subsequent iteration. In this subsequent iteration, all specific control signals previously labeled "unknown format" are not taken into account in the find-match step 206. If there is a match for the first time, it is determined in step 210 whether there is only one candidate set that contains the data item matching the specific signal currently being evaluated, or more candidate sets. If there are two or more candidate sets stored in memory 112 that match the specific control signal currently being evaluated, the user is requested in step 208 to enter a next specific control signal from controller 116, whereupon the procedure returns to step 202. The candidate sets queried in next step 204 are now those that contain the data item(s) validly identified in the previous cycle(s). The procedure stays in the loop of steps 202, 204, 208 and 210 until a single set is found. The single set necessarily includes the data items corresponding to all specific control signals supplied in steps 202 and identified in step 206. Upon having identified this single set, the procedure advances to step 212, wherein programming means 110 writes the identified set to programmable control device 106 to match with the selectable and controllable options in UI 108 for control of the specific apparatus.

Writing of the signals of the identified set to control device 106 so as to configure this device as a controller for, in this example, TV 102, may be achieved in a variety of manners.

For example, control device 106 has multiple user-inputs in the form of buttons such as the Marantz RC2000. Among these buttons is a collection of buttons to select certain control modes: e.g., for a TV, for a VCR, for a DVD-player, a tape recorder, etc. By selecting the proper control mode, particular functions are automatically assigned to the other buttons in accordance with the functionalities of the generic type of apparatus associated with the control mode selected. That is, a button adopts a pre-defined function for each control mode selected. Writing a set of control signals for programming control device 106 for a selected control mode requires that each control signal of the set is programmably linked to a corresponding button. The programming means has for example a display (not shown) that prompts the user to press the desired key to be linked to a respective data item representative of a signal whose function is described on the display. Control device 106 has a programmable memory (not shown) for storing the data item at an address associated with the pressed key.

Alternatively, different addresses of the programmable memory of control device 106 comprise different labels that correspond with labels of the digital words representing the signals of the set. Different labels also correspond with different buttons. A word transferred from the programming means to the memory of control device can then be stored automatically in the memory location with the matching label. This requires the labeling to be prepared in advance in the data base of memory 112 as well as in control device 106 so as to establish a coherent linkage.

Alternatively, the different data items representing a set of control signals are transferred to the memory (not shown) of control device 106 in a predetermined sequence. The sequence of transfer corresponds with a sequence of addresses of the memory that, in turn correspond with an order of the buttons of device 106. This, again requires that the relationship between the sequence and the order of assigning the data items to the buttons is known in advance.

Alternatively, the data of the set is buffered in a memory, together with text or picture data for being displayed on a simple LCD display integrated with control device 106. The user retrieves the data items from the buffer (not shown) one at the time and manually assigns the retrieved data item to a button according to the information being displayed.

Alternatively, or subsidiarily, the set has graphics data in order to visually represent the set's controllable options as icons on a display (not shown) with touch screen functionality integrated with control device 106. In other words, the soft keys and their associated signals are programmed together into control device 106.

As to the buffered signals of unknown format, the user may have some help features that help to properly assign these signals, which are unknown to the data base 112, to user-inputs of device 106. The programming of the signals absent from the data base goes according to, e.g., a method similar to the one used in the RC2000 of Marantz mentioned previously and mentioned in the prior art references cited above The user is notified in step 214 that the set has been written to controller 106. The user can now start the programming procedure for the signals of unknown format or the programming procedure for another set of another conventional controller, e.g., the one for control of VCR 104.

In short, the known programming procedure of the Marantz RC2000 requires each signal to be copied from conventional controller 116 to be entered individually by the user, whereas the invention provides a shortcut by identifying a whole set representative of the conventional controller.

Control device 106 is preferably re-programmable, e.g., in case the user replaces a piece of equipment by another one that requires another set of control signals.

As mentioned above, IR control signals use a pulse-code modulated carrier. The code is binary and varies in time duration and in bit length. Typical examples of the code are the following. In a first encoding scheme, the length of the pulses is varied to encode a logic "0" or a logic "1", and the spaces between successive pulses has a uniform length. In a second example, the length of the spaces between the pulses is varied to represent either a logic "0" or a logic "1". In a third example, all bits have been assigned time intervals of uniform duration, and the direction of the transition (high-to-low, or low-to-high) in the middle of the interval determines the logical value of the bit. Typically, headers are used that precede the transmission of each code word. The header activates the receiver in the apparatus to be controlled. A particular brand of IR controlled equipment typically uses a particular header for all codes. Preferably, the query in memory 112 makes use of the header to identify the particular brand, and, therefore, the candidates among the sets of data stored. Further discrimination is then achieved using, e.g., a lexicographical ordering of the stored data representing the code words used for a particular brand, or any other search strategy that suits the needs.

Figure 3:
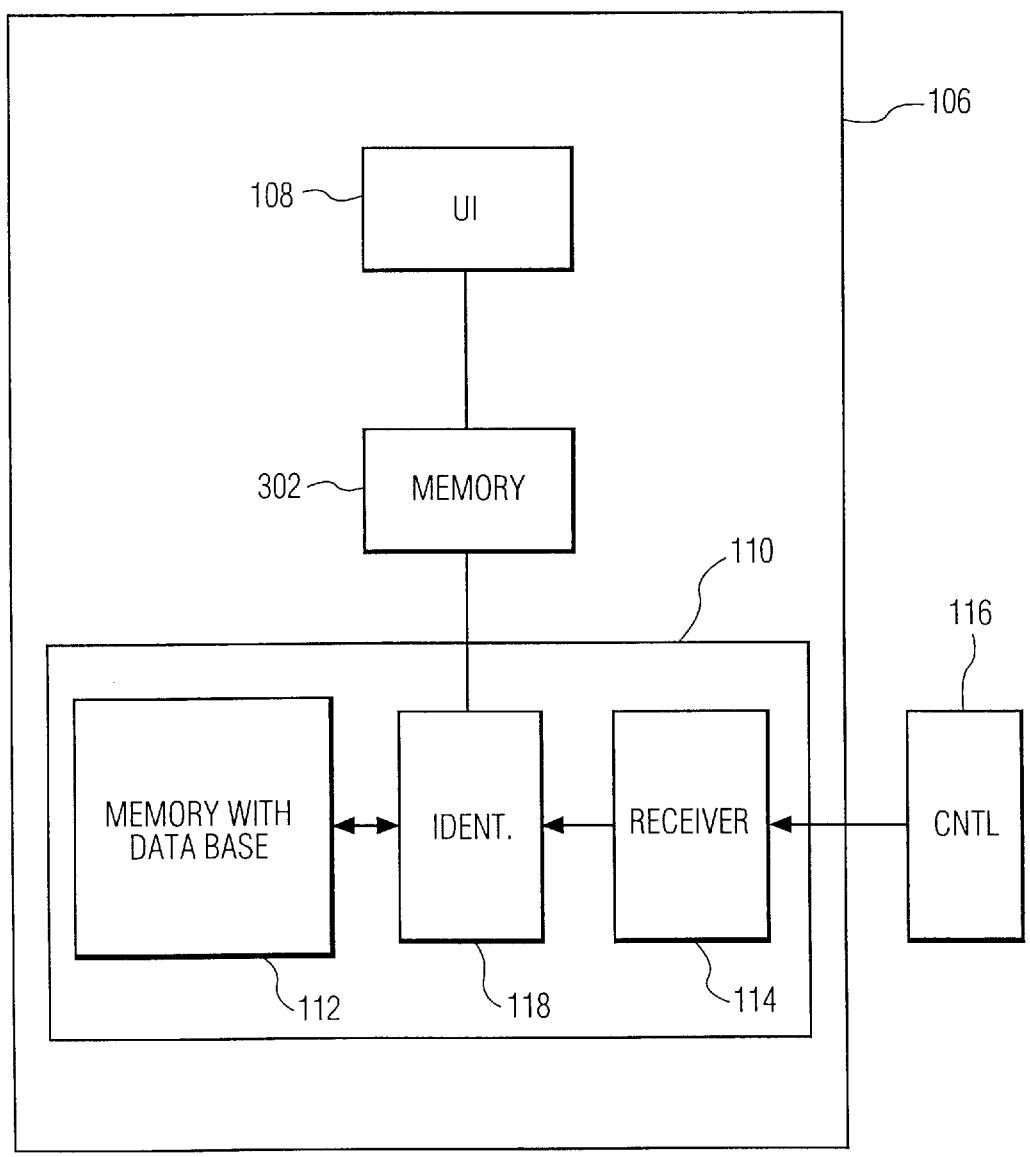
FIG. 3 is a block diagram of a programmable control device according to the invention.

FIG. 3 shows an alternative embodiment 300 of part of system 100. Now programming means 110 is integrated within control device 106 itself. Identifying means 118 is coupled to a memory circuit 302 for writing the buffered signals and the identified set to memory 302. Integration of programming means 110 in control device 106 permits taking into account the now known, organization of the buttons of UI 108 in order to assign the signals to be programmed.

I claim:

1. An information processing system comprising:

an apparatus with multiple user-controllable functionalities;

a programmable control device having a user-interface with multiple user-inputs for selective control of a particular one of the functionalities through sending a particular one of multiple control signals to the apparatus upon the device being programmed;

programming means for programming the control device and comprising:

memory means for storing a data base with a plurality of respective sets of multiple control signals; and an input for receiving a specific control signal from an external agent;

wherein:

the programming means is operative to identify a specific one of the stored sets on the basis of the specific control signal and to program the programmable controller to associate the control signals of the identified set with the multiple user-inputs.

2. The system of claim 1, wherein:

the control device comprises a display with a GUI; and at least one of the sets comprises additional control data to control the display for providing a visual representation of the functionalities associated with the control signals of the identified set.

3. A programmable control device for supplying a particular one of multiple control signals upon user-activation of a particular one of multiple user-inputs, the device comprising:

memory means for storing a data base with a plurality of respective sets of multiple control signals for user-control of a respective apparatus;

an input for receiving a specific control signal;

identifying means connected to the input and the memory means for identifying a specific one of the stored sets on the basis of the specific control signal; and programmable means for programmably associating the control signals of the identified set with the multiple user-inputs.

4. The device of claim 3, further comprising:

a display with a GUI coupled to the programmable means for providing a visual representation of control functionalities associated with the control signals of the identified set.

* * * * *